United States Patent [19]

Saenz et al.

[11] Patent Number: 5,840,129
[45] Date of Patent: Nov. 24, 1998

[54] HESITATION FREE ROLLER

[75] Inventors: Albert M. Saenz; David L. Thrasher, both of Santa Clara; Wilbur C. Krusell; William G. Drapak, both of San Jose, all of Calif.

[73] Assignee: Ontrak Systems, Inc., San Jose, Calif.

[21] Appl. No.: 692,594

[22] Filed: Aug. 6, 1996

Related U.S. Application Data

[62] Division of Ser. No. 275,639, Jul. 15, 1994, abandoned.

[51] Int. Cl.⁶ .............................. C03C 23/00; B08B 7/00; A47L 15/00; A47L 25/00
[52] U.S. Cl. .................................... 134/2; 134/6; 15/88.2; 15/88.3; 15/77; 414/757; 414/433; 198/394
[58] Field of Search .......................... 134/6, 2; 15/340.4, 15/88.3, 88.2, 77; 414/757, 433; 198/394

[56] References Cited

U.S. PATENT DOCUMENTS

| | | | |
|---|---|---|---|
| 2,646,612 | 7/1953 | Shearer | 29/121 |
| 3,599,306 | 8/1971 | Brafford | 29/132 |
| 3,937,919 | 2/1976 | Clerx et al. | 219/216 |
| 4,705,711 | 11/1987 | Perna | 428/141 |
| 4,826,071 | 5/1989 | Becker | 228/160 |
| 5,028,200 | 7/1991 | Shimane | 414/757 |
| 5,129,876 | 7/1992 | Brabant et al. | 493/471 |
| 5,183,378 | 2/1993 | Asano et al. | 414/757 |
| 5,188,273 | 2/1993 | Schmoock | 226/190 |
| 5,391,135 | 2/1995 | Kuroki et al. | 492/35 |
| 5,475,889 | 12/1995 | ThrAsher et al. | 15/88.3 |

*Primary Examiner*—Mary E. Mosher
*Assistant Examiner*—Ali R. Salimi
*Attorney, Agent, or Firm*—Blakely, Sokoloff, Taylor & Zafman LLP

[57] ABSTRACT

A method and apparatus for rotating wafers in a double sided scrubber without slipping or hesitating. A rotating roller imparts rotary motion to a semiconductor wafer during a double sided cleaning process. The rotating roller and wafer contact at their outer edges and the friction between their outer edges causes the wafer to rotate. The roller has an outer edge with a groove. The wafer edge is pinched inside the groove to create enough friction that when cleaning solutions are applied the wafer does not slip and continues to rotate. Also, the groove allows the roller to pinch the wafer just enough so that when the roller reaches the flat of the wafer, the roller may regain the radius of the wafer without hesitating.

7 Claims, 6 Drawing Sheets

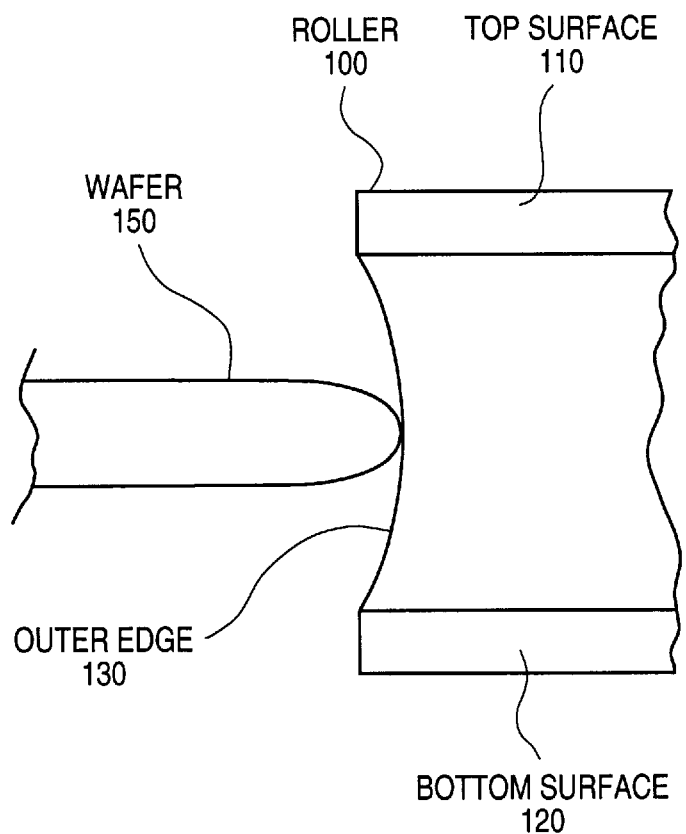
FIG_1
(PRIOR ART)

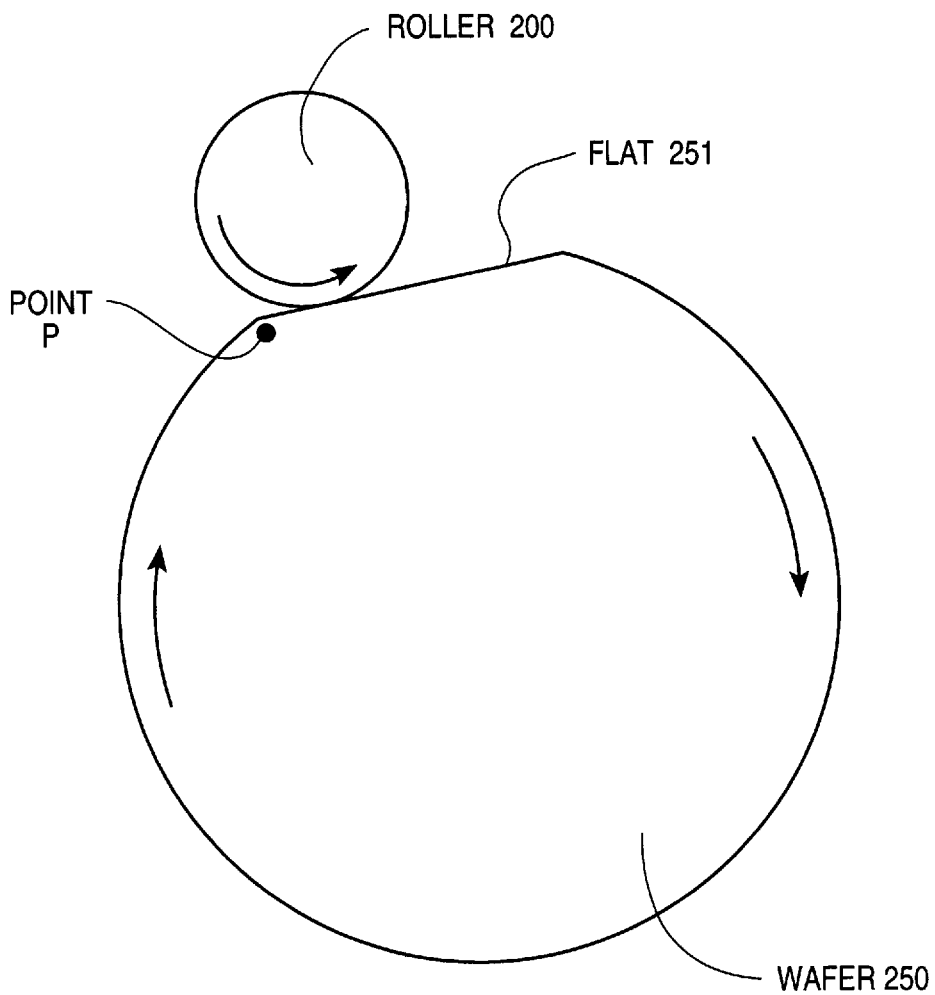
FIG_2

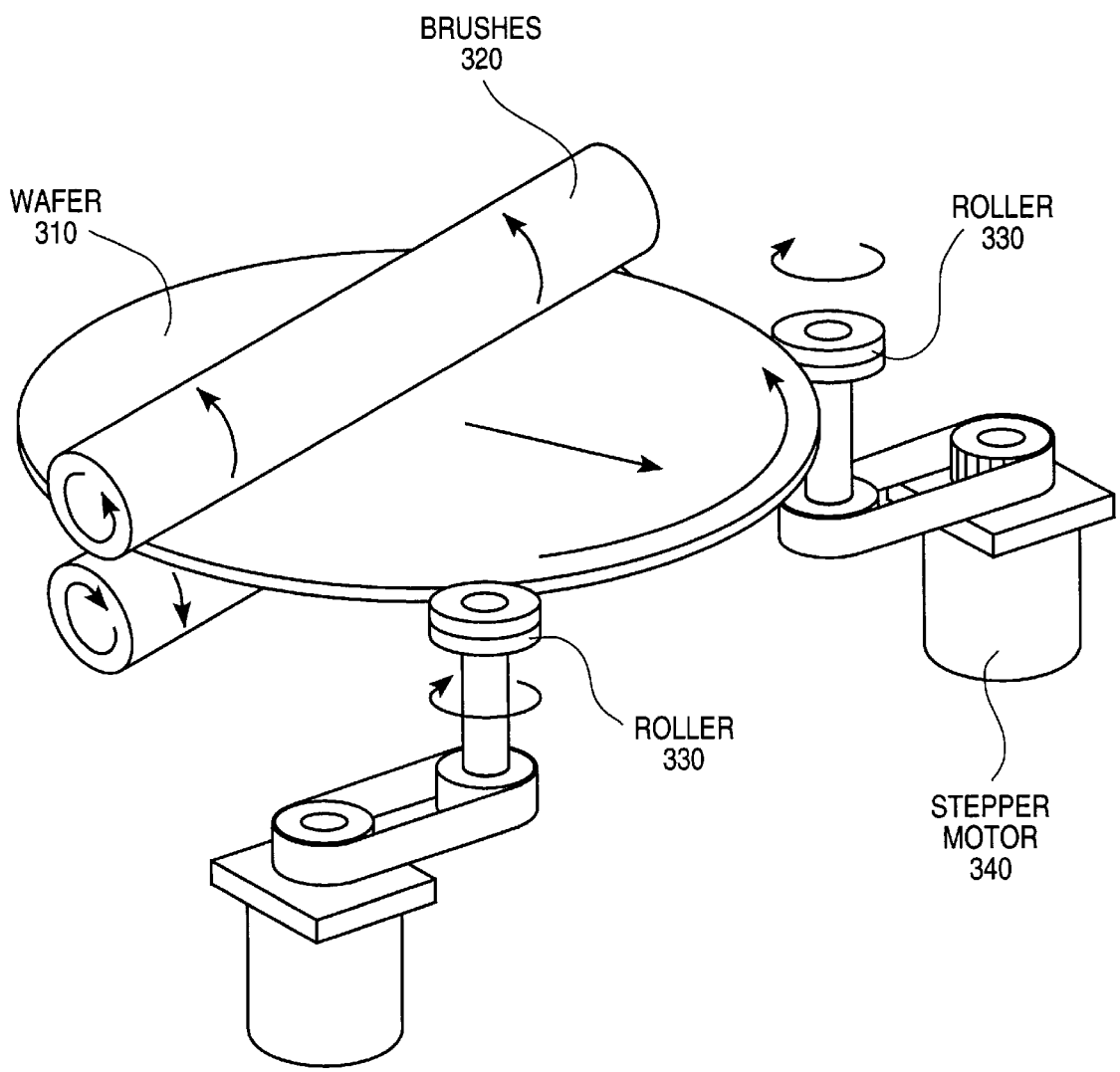
FIG_3

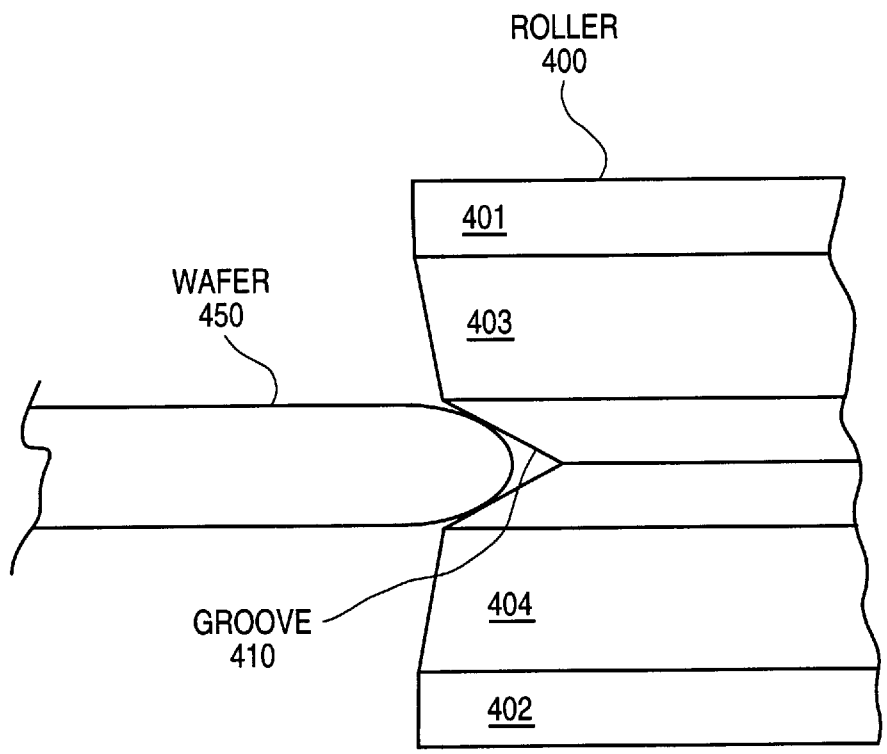
FIG_4

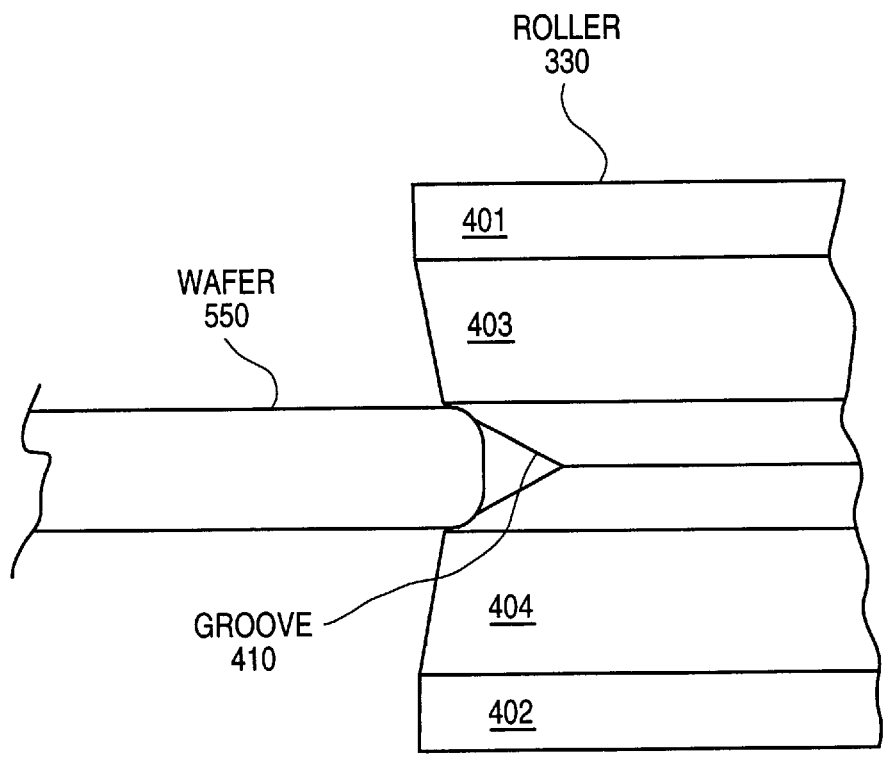
FIG_5

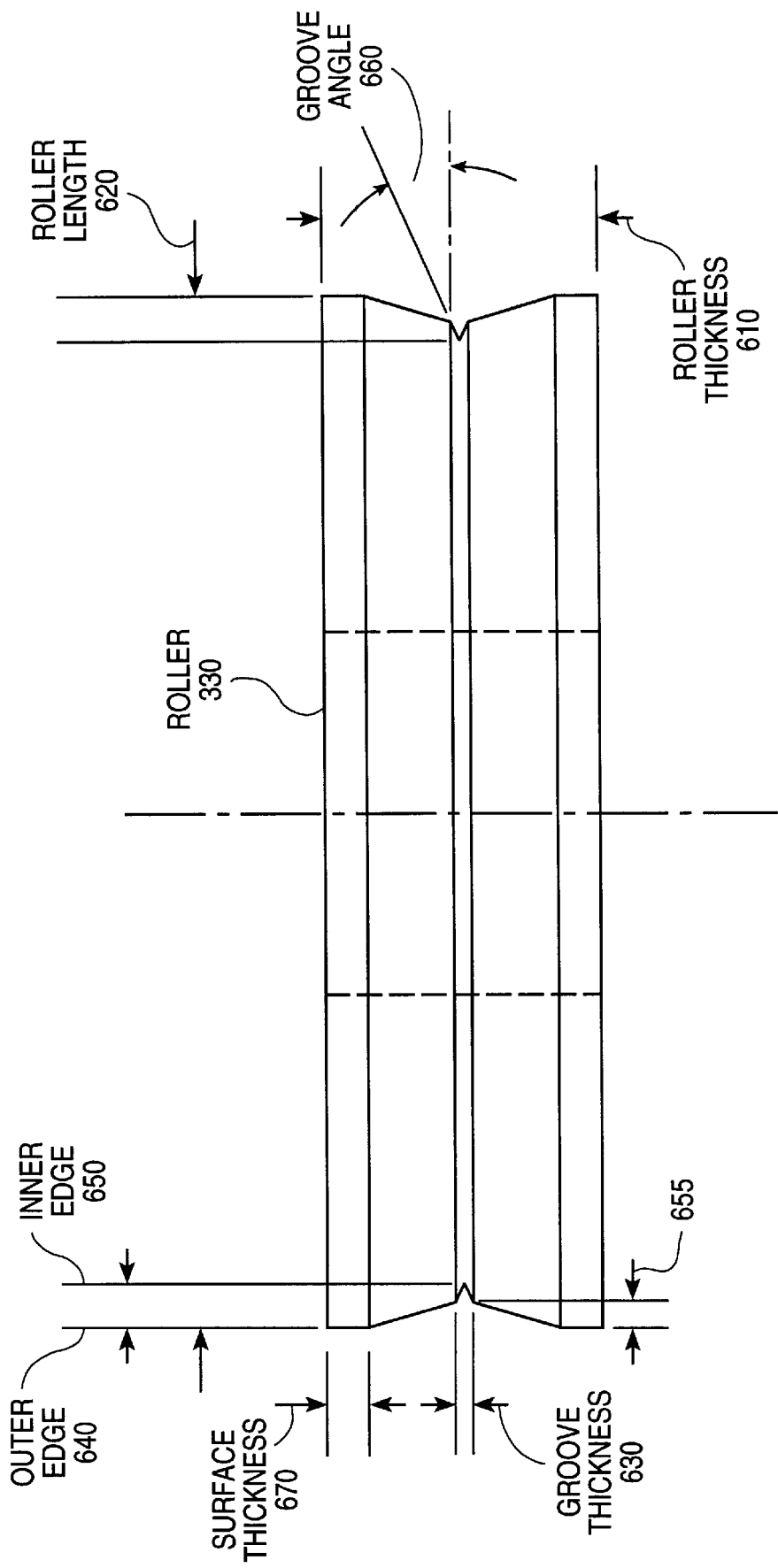
FIG_6

HESITATION FREE ROLLER

This is a divisional of application Ser. No. 08/275,639, filed Jul. 15, 1994, now abandoned.

BACKGROUND OF THE INVENTION

1. Field of the Invention

The present invention relates to semiconductor wafer processing, specifically the cleaning process of a semiconductor wafer.

2. Background Information

In the manufacture of semiconductor devices, the surface of semiconductor wafers must be cleaned of wafer contaminants. If not removed, wafer contaminants may affect device performance characteristics and may cause device failure to occur at faster rates than usual.

One system used to remove wafer contaminants is called a double sided scrubber. In a double sided scrubber a semiconductor wafer is scrubbed simultaneously on both sides by brushes. Since the wafer is being scrubbed simultaneously on both sides by the brushes there must be a way of holding the wafer in place and rotating the wafer so the entire surface of the wafer is cleaned. A mechanism used for this purpose is called a roller.

The double sided scrubber usually comprises a conveyor type mechanism, rollers, and brushes. In general, the wafer lies flat on the conveyor mechanism and the conveyor mechanism moves the wafer into the brushes. While being scrubbed, the wafer is supported (or held horizontally) by the conveyor mechanism, brushes, rollers, or a combination thereof. As the wafer is being scrubbed by the brushes the roller rotates the wafer so the entire wafer surface may be cleaned. The roller itself is being rotated about its central axis by a stepper motor. The rotary motion of the roller is then transferred to the wafer when the edge of the roller comes into contact with the outer edge of the wafer.

FIG. 1 illustrates a prior art roller. The top and bottom surfaces 110 and 120 of the roller are generally flat and the outer edge 130 of the roller has a slight concave indentation (concave outer edge). As is shown in FIG. 1, the concave outer edge of the roller contacts the outer edge of the wafer. When the roller and wafer contact each other, friction between the edges is created, so that the rotation of the roller causes the wafer to rotate. As can be seen from the Figure, the wafer and roller are in essentially single point contact.

One problem with the prior art roller is that the roller/wafer contact may be insufficient, so that the wafer hesitates, i.e., fails to rotate. This problem is worsened when certain cleaning solutions are used, for example ammonium hydroxide (NH$_4$OH). The NH$_4$OH or other cleaning solution acts as a grease between the outer edge of the wafer and the outer edge of the roller, reducing the friction between the edges when they contact. Instead, the rotating roller continually slips off the edge of the wafer without imparting any motion to the wafer.

Another problem with the prior art roller is that the roller tends to stall (hesitate) when the roller is in the flat trying to regain the radius. FIG. 2 illustrates this problem. Most semiconductor wafers have a small portion of their outer edge which is flat, e.g. flat 251. When the roller 200 reaches the point P on the flat 251 the wafer stalls (hesitates) until the roller is able to regain the radius. In other words the wafer hesitates until the roller can reach the curved portion of the outer edge of the wafer 250. This problem arises because the roller is downstream of the brush, such that the brush pushes the wafer into the roller. Therefore, when the flat first encounters the roller, it is pushed into it such that the roller can continue to rotate the wafer along the flat (so long as the above described slipping does not occur). However, the prior art roller may not have enough of a grip to push the wafer back toward the brush to regain the radius.

If the wafer fails to rotate during the scrub operation, some areas of the wafer will not be scrubbed, so that the wafer is not cleaned to the level desired. An additional problem which may occur is that if the system relies on the roller to rotate the flat into a predetermined position for the next operation, the flat may be misplaced. For example, after the scrub operation, the wafer may next go to a spin dry operation where it is held by its edges. If the flat is misplaced, the wafer may not be held properly.

What is needed is a method and apparatus for rotating the wafers in a double sided scrubber without slipping or hesitating.

SUMMARY OF THE INVENTION

The present invention describes a method and apparatus for rotating a semiconductor wafer during the cleaning process in a double sided scrubber without slipping or hesitating. In one embodiment, the apparatus comprises a roller having a groove which pinches the substrate, thereby providing improved contact.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which:

FIG. 1 illustrates a side view of a prior art roller.

FIG. 2 illustrates a prior art roller at the point where stalling occurs.

FIG. 3 illustrates the cleaning process of a wafer in a double sided scrubber.

FIG. 4 illustrates a roller in a preferred embodiment of the present invention turning a semiconductor substrate having a first edge profile.

FIG. 5 illustrates a roller in a preferred embodiment of the present invention turning a semiconductor substrate having a second profile.

FIG. 6 illustrates the dimensions of a preferred embodiment of the present invention.

DETAILED DESCRIPTION

A hesitation free roller is disclosed. In the following description, numerous specific details are set forth such as specific materials, configurations, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

FIG. 3 illustrates the cleaning process of a wafer in a double sided scrubber which incorporates a preferred embodiment of the present invention. Although the present invention is described in conjunction with the scrubbing of a wafer, it will be appreciated that any similarly shaped, i.e. generally flat substrate, may be processed by the methods and apparatuses of the present invention. Further, it will appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) devices, or substrates for processing other apparatuses and devices such as flat panel displays, multichip modules, etc. The wafer 310 is placed between the brushes 320 of the double sided scrubber. Stepper motor 340 rotates the roller 330 of the present invention. When the roller 330 is in contact with the wafer 310 friction is created between their edges. Thus, the rotating motion of the roller 330 and the friction that is created causes the wafer 310 to rotate. The rotation of the wafer 310 between the brushes 320 allows the entire surface of the wafer to be cleaned. As can be seen, in a preferred embodiment, two rollers 330 contact the wafer at two locations to rotate the wafer and to hold it in place (i.e., prevent forward motion) as it is scrubbed.

FIG. 4 illustrates a roller 330 in a preferred embodiment of the present invention. The roller 330 comprises a somewhat flexible material. In general, the material of the roller should have a sufficient softness such that the roller pinches the wafer's edge as described herein. Additionally, the material is preferably machinable, as it is desirable to avoid the high cost of tooling for molded rollers, and to avoid the particle generation of parting lines. The material should not, however, generate excessive particles in use. Further, the material should have a sufficient memory to retain its shape. In a preferred embodiment, a urethane, for example, 70 Durometer natural urethane is utilized. This material has been found to have sufficient softness, machinability, memory and low particle generation to meet the needs of the present invention. As shown, the top and bottom surfaces of roller 330 are generally flat. In a currently preferred embodiment, roller 330 has flat portions 401 and 402, slightly indented portions 404 and 403, and also an inner groove (groove) 410. When a wet wafer is being cleaned between the brushes, it is pushed forward and inserted into the groove 410 of roller 330, such that groove 410 pinches the wafer 450 causing increased contact, and therefore, increased friction on roller 330 and the edge of wafer 450. Thus, when the roller 330 is rotated the friction causes wafer 450 to rotate. When cleaning solutions such as ammonium hydroxide ($NH_4OH$) are used, the pinching of the wafer creates enough friction that the wafer 250 does not slip. Additionally, the pinching of the wafer squeezes the cleaning solution off of the edge, so that there is not an excessive amount of solution in the contact area between the roller and the wafer's edge.

Also, when the hesitation free roller reaches the point P of the flat (as illustrated in FIG. 2) the pinching of the wafer creates enough friction on the edge of the wafer allowing the roller to regain the radius without stalling. In other words, the roller pinches the wafer enough that it grips the edge of the wafer allowing the roller to reach the curved portion of the wafer without hesitating.

FIG. 5 illustrates a wafer 550 in groove 410 of roller 330. As can be seen from the Figure, the edge profile of the wafer 550 is substantially more square than that of wafer 450. Because the roller 330 is made of a flexible material, groove 410 deforms slightly to fit the edge of wafer 550, providing improved contact with it, as with wafer 450.

FIG. 6 illustrates the dimensions of a preferred embodiment of the present invention for use with a 6.0 inch (150 mm) wafer. It will be obvious to one of skill in the art that any of the dimensions may vary depending upon the wafer diameter and thickness and may be adjusted to serve the purpose of the present invention. The dimensions given below for roller 330 are merely an example of a preferred embodiment of the present example and are meant simply to illustrate, and not limit the scope of the present invention. As described herein, it is desired for the groove to pinch the wafer or to some extent conform to the edge of the wafer. It is further desired that the pinching action does not occur on the upper or lower surface of the wafer. Therefore, the groove should have a shape and dimension such that the wafer may not be inserted into and gripped by contact between the groove wall and the upper and lower surfaces of the wafer. In this regard, the "V" shape disclosed is advantageous since as the edge enters the groove, it contacts the groove at a narrow location of the groove while the surfaces of the wafer are near or within a wider portion of the groove, thus avoiding contact. Further, the groove should not be too shallow such that the leading edge of the wafer contacts the apex of the groove, prior to the walls of the groove pinching the edges, thereby resulting in single point contact.

In a currently preferred embodiment, groove thickness 630 at the outer opening of the groove ranges from approximately 0.005–0.040 inch in a currently preferred embodiment and, in general, is approximately equal to (e.g., within 25% of) the thickness of the wafer. For example, in one embodiment groove thickness 630 is preferably tailored to be approximately 0.005 inch greater than the thickness of the wafer. The distance between outer edge 640 and inner edge 650 is, in a preferred embodiment, approximately 0.067 inches. The distance 655 from the outer edge 640 to the center of curvature of the groove 410 is approximately 0.620 inch a currently preferred embodiment. The maximum radius of curvature from this point is approximately 0.005 inch. In the manufacture of the roller 330, the roller is machined in a frozen state, as it is too flexible for machining otherwise. Since the portion of the bit which carves the groove 410 is relatively small, it will wear over time. Therefore, initially the radius of curvature may be less than the 0.005 inch specified above, as virtually all wafer edges will be gripped without penetrating any further. However, once the bit is worn down such that its radius of curvature is any greater than 0.005 inch, the bit should be replaced so that subsequent rollers manufactured with a bit continue to grip all wafers. Groove angle 560, in a preferred embodiment, is approximately 24°.

Also in a currently preferred embodiment, roller thickness 610 is approximately 0.433 inch. Roller length 620 is approximately 1.625 inches. It should be noted that since the roller material is somewhat flexible the greater the surface thickness 670 the more rigid roller 330 becomes. The surface thickness 670 may be varied to give desired degree of flexibility in the groove and tightness of the pinch. A greater surface thickness 670 leads to less flexibility, and therefore a tighter pinch. Conversely, a thinner surface thickness 670 leads to more flexibility and a less tight pinch. Various thicknesses may be used to achieve the desired flexibility, for allowing the wafer to slip into the groove 410, while still giving sufficient pinch. In a preferred embodiment the surface thickness 670 is approximately 0.062 inch.

It will be appreciated that many modifications of roller 330 may be made within the spirit and scope of the present invention. Referring to FIGS. 4 and 5, note that the presence of the groove 410 provides for contact at at least two points, compared with the single point contact of the prior art roller 100. In this regard, it will be appreciated that the "point" of the contact is in reality a small area. It will further be appreciated that due to the pinching of the groove 410, each of the two points of contact of the present invention are generally larger areas than the prior art single point contact. Thus, any shaped groove which provides this increased contact will achieve the objects of the present invention. For example, although a "V" shaped groove has been illustrated, it will be appreciated that other shapes such as a "U" shaped groove, a substantially square groove, a groove with curved walls, etc., may be used. Further, it will be appreciated that the groove need not be uniform. For example, the groove may have a wide angle at the opening, and a narrower angle farther in. In this regard, the roller may not have a discrete groove as such, but rather may have a pinched "V" shape e.g., a gradual and continuous transition from the substantially straight sidewall of the roller at the top and bottom to the gripping, groove shape section in the middle. Therefore, reference herein to a groove is not meant to limit the invention to rollers having a discrete, discernible groove but rather encompasses any roller having a portion which pinches the edge of the wafer or conforms, at least to some extent, to the edge of the wafer as described herein. If desired, the groove can be tailored to the edge profile of a specific type of substrate. For example, the groove may have a portion which essentially mates with the edge of the wafer. Typically, the portion which mates with the edge is slightly smaller than the edge to provide better contact. However, wafer specific grooves have not been found to be necessary since, as described in conjunction with FIGS. 4 and 5, the same groove 410 has been successful in rotating wafers having different edge profiles. In general, the groove 410 has a thickness (dimension 630 of FIG. 6) greater than the leading portion of the edge of the wafer, so that the wafer edge readily fits into the groove 410. Additionally, the groove narrows sufficiently (e.g., by having a maximum radius of curvature from a specified point, as in the embodiment described in relation to FIG. 6) to pinch the wafer within the groove, without contacting the top or bottom surfaces of the wafer.

Thus, a hesitation free roller has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method of rotating a substrate comprising:

contacting said substrate with a roller, said roller having a V-shaped groove that contacts an edge of said substrate;

pinching said substrate with said roller to increase the friction between said substrate and said roller, wherein said v-shaped groove pinches said edge of said substrate; and turning said roller while pinching said substrate to thereby rotate said substrate.

2. The method as described in claim 1 wherein said method is performed while said substrate is scrubbed on both sides with a first brush and a second brush.

3. The method as described in claim 1 wherein said method is performed while said substrate is scrubbed on both sides with a first brush and a second brush.

4. The method as described in claim 1 wherein said groove has an opening of within approximately 25% of the thickness of said substrate.

5. A method of rotating a substrate during a scrubbing process comprising:

contacting said substrate with a roller, said roller having a v-shaped groove that contacts an edge of said substrate;

pinching said substrate with said roller to increase the friction between said substrate and said roller, wherein said v-shaped groove pinches said edge of said substrate;

turning said roller while pinching said substrate to thereby rotate said substrate; and scrubbing said substrate while turning said roller.

6. The method as described in claim 5 wherein said method is performed while said substrate is scrubbed on both sides with a first brush and a second brush.

7. The method as described in claim 5 wherein said groove has an opening of within approximately 25% of the thickness of said substrate.

* * * * *